United States Patent
Thompson (10) Patent No.: US 9,896,327 B2
(45) Date of Patent: Feb. 20, 2018

(54) CMOS-MEMS STRUCTURES WITH OUT-OF-PLANE MEMS SENSING GAP

(71) Applicant: INVENSENSE, INC., San Jose, CA (US)

(72) Inventor: Matthew Julian Thompson, Beaverton, OR (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/158,947

(22) Filed: May 19, 2016

(65) Prior Publication Data

US 2017/0334709 A1    Nov. 23, 2017

(51) Int. Cl.
*H01L 29/00* (2006.01)
*B81B 3/00* (2006.01)
*H01L 41/113* (2006.01)

(52) U.S. Cl.
CPC .......... *B81B 3/0021* (2013.01); *H01L 41/113* (2013.01); *H01L 41/1132* (2013.01); *H01L 41/1134* (2013.01); *B81B 2201/0264* (2013.01); *B81B 2201/036* (2013.01); *B81B 2203/0307* (2013.01); *B81B 2203/0315* (2013.01); *B81B 2207/09* (2013.01)

(58) Field of Classification Search
CPC ............. H01L 29/84; H01L 2924/1461; H01L 41/113; H01L 41/1132; H01L 41/1134; H01L 41/1138; B81B 2201/0264; B81B 3/0021
USPC .......................................... 257/369, 415, 522
See application file for complete search history.

(56) References Cited

U.S. PATENT DOCUMENTS

| | | | | |
|---|---|---|---|---|
| 9,340,414 | B2 * | 5/2016 | Yoneoka | B81C 1/00246 |
| 2009/0193903 | A1 * | 8/2009 | Cobianu | B60C 23/0408 73/715 |
| 2010/0006959 | A1 * | 1/2010 | Kim | B81C 1/00301 257/415 |
| 2012/0025333 | A1 * | 2/2012 | Yoshida | G01P 15/0802 257/415 |
| 2013/0140651 | A1 * | 6/2013 | Chen | H03H 3/007 257/415 |
| 2013/0299925 | A1 * | 11/2013 | Classen | B81B 3/0018 257/415 |
| 2014/0145244 | A1 | 5/2014 | Daneman et al. | |

(Continued)

FOREIGN PATENT DOCUMENTS

WO     2013003789 A1     1/2013

OTHER PUBLICATIONS

International Search Report and Written Opinion for International Application No. PCT/US2017/032916 dated Jul. 17, 2017, 15 pages.

*Primary Examiner* — Matthew E Warren
(74) *Attorney, Agent, or Firm* — Amin, Turocy & Watson, LLP (57) ABSTRACT

A micro-electro-mechanical system sensor device is disclosed. The sensor device comprises a micro-electro-mechanical system (MEMS) layer, comprising: an actuator layer and a cover layer, wherein a portion of the actuator layer is coupled to the cover layer via a dielectric; and an out-of-plane sense element interposed between the actuator layer and the cover layer, wherein the MEMS device layer is connected to a complementary metal-oxide-semiconductor (CMOS) substrate layer via a spring and an anchor.

36 Claims, 8 Drawing Sheets

(56) References Cited

U.S. PATENT DOCUMENTS

| | | |
|---|---|---|
| 2015/0111332 A1 | 4/2015 | Lee |
| 2016/0107881 A1 | 4/2016 | Thompson et al. |
| 2016/0159642 A1* | 6/2016 | Hooper ................ B81B 7/0061 257/419 |
| 2016/0187370 A1* | 6/2016 | Ikehashi ............... G01P 15/125 73/514.32 |
| 2016/0362293 A1* | 12/2016 | Smeys ................... B81B 7/007 |

* cited by examiner

CMOS-MEMS STRUCTURES WITH OUT-OF-PLANE MEMS SENSING GAP

TECHNICAL FIELD

The subject disclosure relates to micro-electro-mechanical sensor devices that have stable electrodes that are insensitive to the non-linear properties of metal eutectic bonding that bond micro-electro-mechanical system (MEMS) layers and complementary metal-oxide semiconductor (CMOS) layers.

BACKGROUND

Metal, like aluminum-germanium (Al—Ge) used for eutectic bonding of micro-electro-mechanical system (MEMS) devices to complementary metal-oxide semiconductor (CMOS) layers, can exhibit non-linear behavior when the material is overloaded past its linear operating range. Overloading can come from exogenous loading like thermal, packaging, thermal bonding, assembly, shock and other external loads. Some MEMS devices bonded to CMOS an out-of-plane sense electrode is interposed between a moving MEMS structure and the CMOS top metal electrode. The mechanical connection across this sense electrode contains metal and when the device is overloaded from exogenous inputs has nonlinear behavior which is undesirable and for MEMS sensors is transduced into a false signal. It is therefore beneficial to have a mechanical connection across the sense gap which does not contain any metal.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with an embodiment, the subject application discloses a sensor device, comprising: a micro-electro-mechanical system (MEMS) layer, comprising: an actuator layer and a cover layer, wherein a portion of the actuator layer is coupled to the cover layer via a dielectric, and wherein the actuator layer moves out-of-plane in response to a stimulus; and an out-of-plane sense element interposed between the actuator layer and the cover layer, wherein the MEMS device layer is connected to a complementary metal-oxide-semiconductor (CMOS) substrate layer via a spring and an anchor.

The CMOS substrate layer further comprising integrated circuits arranged to output signal data indicating a change in the stimulus. When the stimulus is barometric pressure applied to the actuator layer the integrated circuits output signal data indicating a change in the barometric pressure.

The sensor device further comprising a CMOS sensing element interposed between a CMOS top electrode and the actuator layer, wherein the CMOS top electrode is selectively formed or partially deposited over the CMOS substrate layer. The CMOS sensing element can, for example, detect ambient humidity, airborne particles or acceleration of the actuator layer. The CMOS substrate layer can output signal data based on, or as a function of, first data received from the sense element and/or second data received from the CMOS sensing element, wherein the first data and the second data can represent a stimulus being applied to the actuator layer. In instances where the output signal is first signal data, the CMOS substrate layer can output third signal data representing an out-of-plane acceleration of the MEMS actuator layer.

The sensor device further comprising an actuator interposed between the CMOS top electrode and the actuator layer, such that the top electrode actuates the MEMS device layer out-of-plane and creates an air pump.

The sensor device further comprising; a sealed cavity formed between the actuator layer and the cover layer; a conductor that electrically couples the cover layer to the CMOS substrate layer; a reference layer coupled via a dielectric to the cover layer; and a reference element formed between the reference layer and the cover layer. The MEMS actuator layer and the CMOS substrate layer coupled with at least one eutectic bond.

The out-of-plane sense element can be a variable capacitor between the actuator layer and the cover layer, the spring can be formed in the actuator layer and/or the spring can be formed in the cover layer. In accordance with an embodiment, the anchor can be centrally located on the actuator layer.

In accordance with a further embodiment a disclosure is made of a micro-electro-mechanical sensor device, comprising: a micro-electro-mechanical system (MEMS) layer, comprising: an actuator layer partially coupled, by a dielectric, to a cover component; an out-of-plane element formed between the actuator layer and the cover component, wherein the out-of-plane element can be a variable capacitor formed between the actuator layer and the cover component; an anchor component and a spring component that couples the MEMS layer to a complementary metal-oxide semiconductor (CMOS) layer; and a conductor that electrically couples the cover component and the CMOS layer, wherein the conductor can be a conductive material such as but not limited to polysilicon, tungsten, gold, titanium, titanium nitride, aluminum, and/or germanium.

The MEMS layer can further comprise: a sealed cavity formed or constructed between the cover component and the actuator layer, wherein the cover component and the actuator layer are mechanically bonded to form the sealed cavity; and a reference layer connected to the cover component with a dielectric, wherein a reference element is formed between the reference layer and the cover component, and wherein the reference layer is connected to the CMOS layer that outputs signal data representing a stimulus being applied to the actuator layer as measured by the out-of-plane element and the reference element.

The CMOS layer can comprise a top electrode that can detect an ambient humidity and/or chemical particulate matter, as well as cause the MEMS layer to oscillate to form an air pump. The CMOS layer, in situations when the out-of-plane element is a first out-of-plane element, can further comprise a second out-of-plane element that can be formed between the top electrode and the actuator layer. The CMOS layer can output signal data representative of a stimulus acting on the actuator layer as measured by the first out-of-plane electrode and the second out-of-plane electrode. In situations where the signal data represents first signal data, and the CMOS layer can output second signal data that can be representative of an acceleration of the MEMS layer as measured by the second out-of-plane element.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present disclosure will be apparent upon consideration of the following detailed description, taken in conjunction with the accompanying drawings, in which like reference characters refer to like parts throughout, and in which.

DETAILED DESCRIPTION

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The subject application discloses and describes a micro-electro-mechanical sensor device comprising: a complementary metal oxide semiconductor (CMOS) substrate layer and a micro-electro-mechanical system (MEMS) device layer, wherein the MEMS device layer comprises: an actuator layer, wherein a portion of the actuator layer is coupled to a cover/handle layer with a dielectric; a first out-of-plane sense electrode is connected between the actuator layer and the cover/handle layer; at least one anchor and at least one spring connect the MEMS device layer to the CMOS substrate layer, wherein a force or stimulus acting on the actuator layer causes a change in the out-of-plane sense electrode, and wherein the CMOS substrate layer outputs a signal based on, or as a function of, the out-of-plane sense electrode that is responsive to the stimulus acting on the actuator layer.

Further, the MEMS device layer can further comprise a sealed reference cavity that can be employed, for instance, to construct a pressure sensor, wherein when a force or stimulus impinges on the actuator layer this can provide an indication of an ambient pressure acting on the actuator layer. Additionally, the first out-of-plane sense electrode can typically be a variable capacitor formed between the actuator layer and the cover/handle layer; the at least one spring can be constructed/formed in the actuator layer; the at least one spring can be constructed in the cover/handle layer; and the anchor can be centrally located on the actuator layer. Further, the MEMS device layer can include a metal or non-metal conductor like a polyvia, that can electrically couple across the dielectric layer between actuator and the cover/handle layer so that the electrical node of the cover/handle is connected to the CMOS substrate layer.

Moreover, the MEMS device layer can further comprise a reference layer connected to the cover/handle layer with a dielectric, a gap reference electrode can be formed between the reference layer that can be connected to the CMOS substrate layer and the cover/handle layer, and the CMOS substrate layer can output a signal based on, or as a function of, the first out-of-plane sense electrode and the gap reference electrode that can be proportional to a force/stimulus acting on the actuator layer. Additionally, the CMOS substrate layer can have formed thereupon a top electrode. The CMOS substrate layer can also comprise a second out-of-plane sense electrode formed between the top electrode and the actuator layer, wherein the CMOS substrate layer outputs a signal as a function of, or based on, the first out-of-plane sense electrode and/or the second out-of-plane sense electrode that is responsive to the forces/stimuli acting on the actuator layer (e.g., the first out-of-plane sense electrode can detect a first force/stimulus and/or the second out-of-plane sense electrode can detect a second force/stimulus, wherein the first force/stimulus and the second force/stimulus can be distinct and unique). Furthermore, the CMOS substrate layer can output a second signal based on the second out-of-plane sense electrode that is proportional to the out-of-plane acceleration of the MEMS device layer.

The top electrode formed on the CMOS substrate layer can be utilized, for example, to detect an ambient humidity, detect airborne chemicals or other particulate matter, and can be utilized to actuate the MEMS device layer to perform as a pump.

Figure 1:
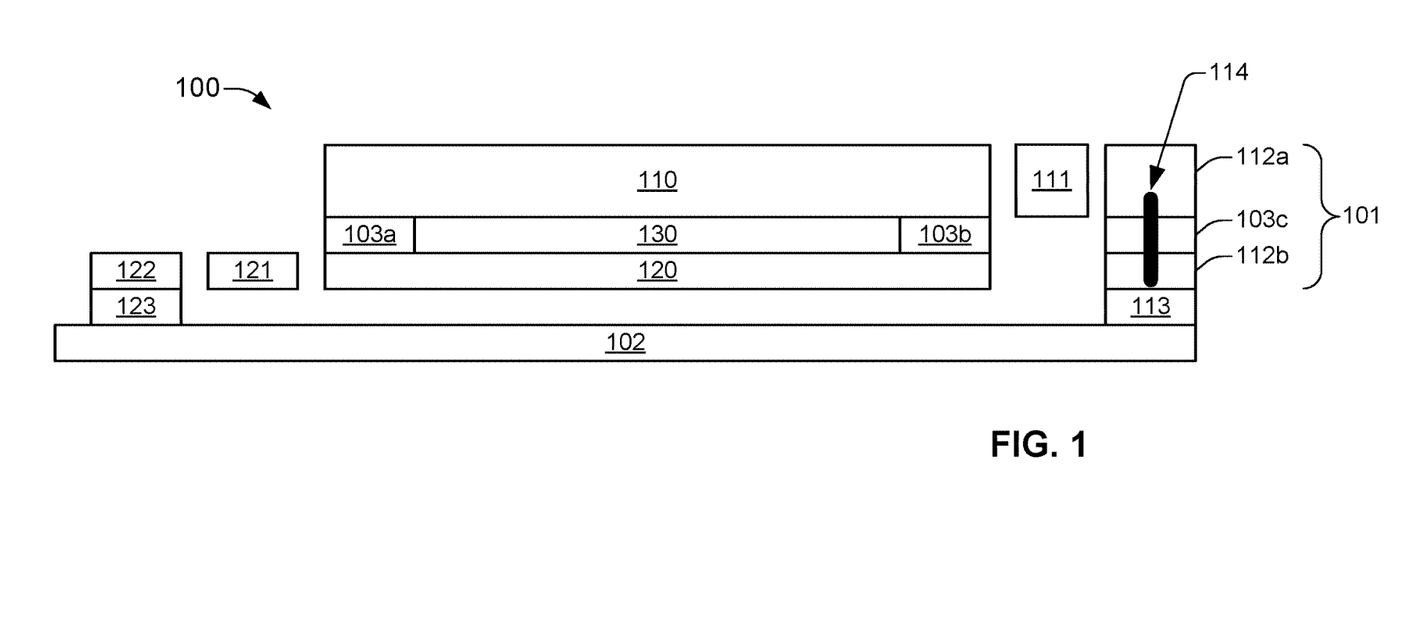
FIG. 1 illustrates a cross-section view of a sensor device 100 in accordance with a first embodiment.

FIG. 1 illustrates a cross-section view of a sensor device 100 in accordance with a first embodiment. As illustrated, the sensor device 100 comprises a MEMS structure 101 that is electrically and mechanically bonded to a CMOS structure 102 with eutectic bonds 113 and 123. MEMS structure 101 can comprise a handle wafer (cover layer/component) 110 that can be fusion bonded to an actuator layer 120 with bonds 103a, 103b, and 103c. Bonds 103a, 103b, and 103c provide mechanical bonds but not electrical bonds. A sense gap 130 is created between the handle wafer 110 and the actuator layer 120. The handle wafer 110 is electrically connected to the CMOS structure 102 via a spring 111, a cover post 112a, a conductor 114, actuator post 112b, and eutectic bond 113. The actuator layer 120 is connected to the CMOS structure 102 via spring 121, actuator post 122, and eutectic bond 123. A variable capacitor across sense gap 130 can be electrically excited by the CMOS structure 102 by the two connections formed between the eutectic bond 123 and actuator layer 120 and the eutectic bond 113 and handle wafer 110.

Sensor device 100 can form a capacitive pressure sensor when the sense gap 130 is also a sealed chamber. Sensor device 100 under an ambient change in pressure will cause the actuator layer 120 to deflect. This deflection can cause a change in the sense gap 130 which changes the variable capacitor. The variable capacitor can be electrically excited by the CMOS structure 102 through eutectic bonds 123 and 113 and a signal processor in the CMOS structure 102 can output a signal that is related to the applied pressure.

As will be appreciated by those of ordinary skill, and without limitation or departing from the foregoing, it will be noted that springs 121 and/or 111 can be flexible or rigid. Further, it will also be noted, cover or handle layer/component 110 and the actuator layer 120 can have the same thickness and both the cover or handle layer/component 110 and actuator layer 120 can both deflect and/or oscillate towards and away from one another.

Figure 2:
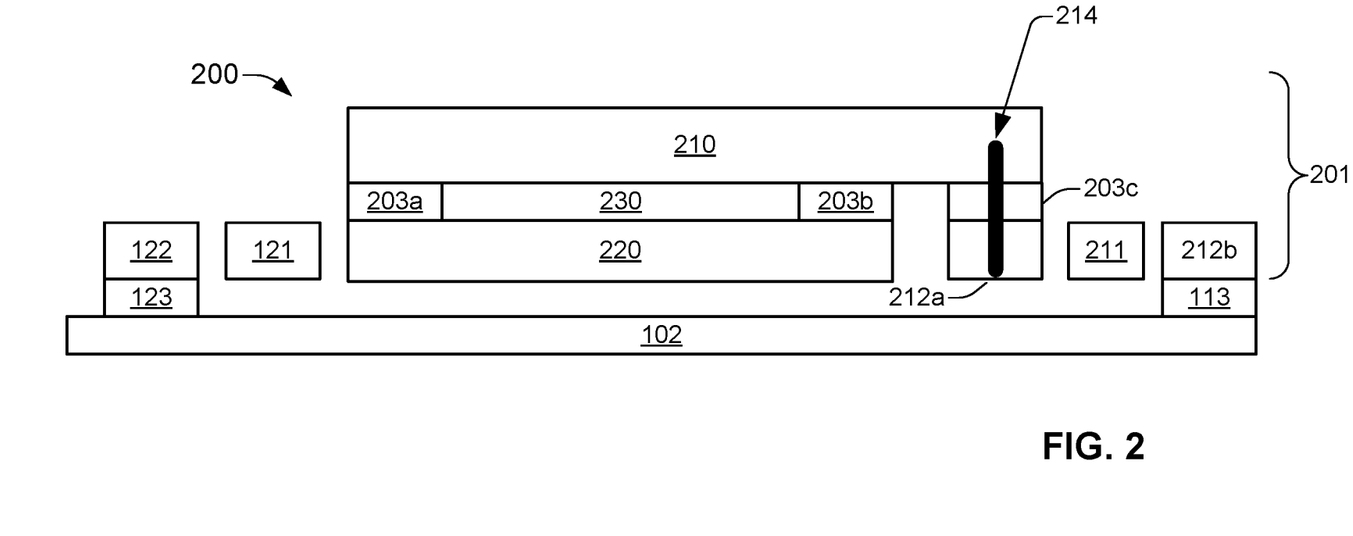
FIG. 2 illustrates a cross-section view of a sensor device 200 in accordance with a second embodiment.

FIG. 2 illustrates a cross-section view of a sensor device 200 in accordance with a second embodiment. Sensor device 200 is similar to sensor device 100 illustrated in FIG. 1. Sensor device 200 comprises a MEMS structure 201 electrically and mechanically bonded to a CMOS structure 102 with eutectic bonds 113 and 123. MEMS structure 201 can comprise a handle wafer 210 fusion bonded to an actuator layer 220 with bonds 203a, 203b, and 203c. Bonds 203a, 203b, and 203c provide mechanical bonds but not electrical bonds between the handle wafer 210 and the actuator layer 220. A sense gap 230 can be created between the handle wafer 210 and the actuator layer 220. The handle wafer 210 can be electrically connected to the CMOS structure 102 via a metal conductor 214, actuator conductor 212a, actuator spring 211, actuator post 212b, and eutectic bond 113. Further, the actuator layer 220 is also connected to the CMOS structure 102 via spring 121, actuator post 122, and eutectic bond 123. Sensor device 200 can form a capacitive pressure sensor where the CMOS structure 102 can output a signal that is related to ambient pressure.

Figure 3:
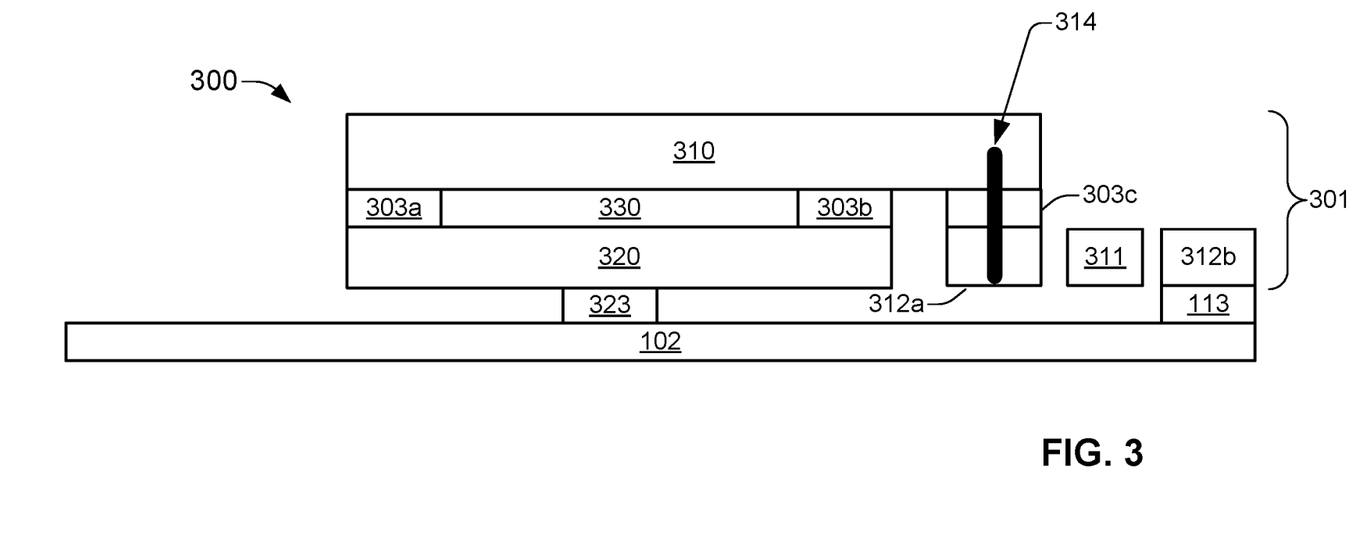
FIG. 3 illustrates a cross-section view of a sensor device 300 in accordance with a third embodiment.

FIG. 3 illustrates a cross-section view of a sensor device 300 in accordance with a third embodiment. As depicted, sensor device 300 comprises a MEMS structure 301 that can be electrically and mechanically bonded to a CMOS structure 102 with eutectic bonds 113 and 313. MEMS structure 301 can comprise a handle wafer 310 that is fusion bonded to an actuator layer 320 with bonds 303a, 303b, and 303c that can provide mechanical bonds but not electrical bonds between handle wafer 310 and actuator layer 320. A sense gap 330 can be created between bond 303a, bond 303b, handle wafer 310, and actuator layer 320. Handle wafer 310 can be electrically connected to the CMOS structure 102 via a metal conductor 314, actuator conductor 312a, actuator spring 311, actuator post 312b, and eutectic bond 113. Actuator layer 320 can also be connected to the CMOS structure 102 via centrally located eutectic bond 323 that removes the flexible coupling associated with actuator 320. Centrally located eutectic bond 323 is advantageous as it reduces false signals caused from exogenous forces acting on sensor device 300. Exogenous forces can be from thermal loading, shock loading, packaging, assembly and others. The central eutectic bond 323 reduces the exogenous forces transferring to the actuator layer 320.

Figure 4:
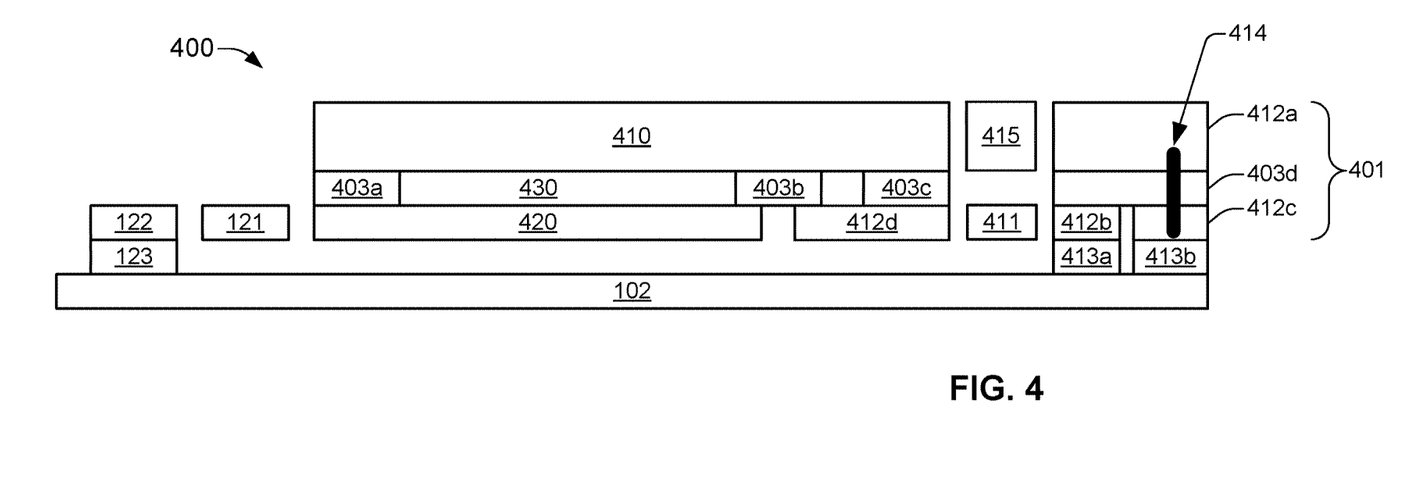
FIG. 4 illustrates a cross-section view of a sensor device 400 in accordance with a fourth embodiment.

FIG. 4 depicts a cross-section view of a sensor device 400 in accordance with a fourth embodiment. As illustrated, sensor device 400 comprises a MEMS structure 401 configured to be electrically and mechanically bonded to a CMOS structure 102 with eutectic bonds 123, 413a, and 413b. MEMS structure 401 can comprise a handle wafer 410 fusion bonded to an actuator layer 420 with mechanical bonds 403a, 403b, 403c, and 403d. Mechanical bonds 403a, 403b and 403c are dielectric bonds between handle wafer 410 and the actuator layer 420. A sense gap 430 can be formed between handle wafer 410, mechanical bond 403a, mechanical bond 403b, and the actuator layer 420. Handle wafer 410 can be electrically connected to the CMOS structure 102 via spring 415, conductor 414, actuator connector 412c, actuator post 412c, and eutectic bond 413b. Additionally, a gap electrode 412d is connect to the CMOS structure 102 via the spring 411, actuator post 412b, and eutectic bond 413a. The gap electrode 412d can be configured to form a fixed capacitor between the gap electrode 412d and the handle wafer 410. Further, the actuator layer 420 can also be connected to the CMOS structure 102 via spring 121, actuator post 122, and eutectic bond 123.

Sensor device 400 can be a pressure sensor, wherein a variable gap capacitor is formed between gap electrode 412d and the handle 410. The variable gap capacitor can be combined with the variable capacitor in the CMOS signal processor. Sensor device 400 under an ambient pressure change combines with the variable capacitor with the variable gap capacitor in the CMOS signal processor to output a signal related to the applied pressure.

Figure 5:
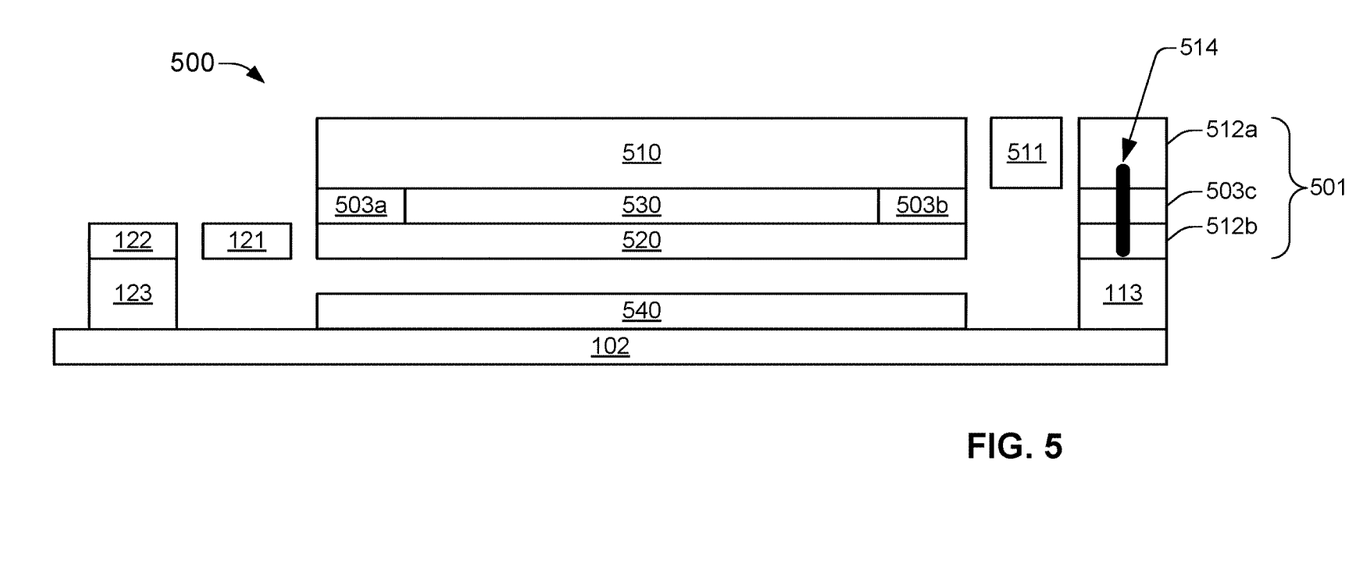
FIG. 5 illustrates a cross-section view of a sensor device 500 in accordance with a fifth embodiment.

FIG. 5 illustrates a cross-sectional view of a sensor device 500 in accordance with a fifth embodiment. As depicted, sensor device 500, similar to sensor device 100 depicted in FIG. 1, can comprise a MEMS structure 501 that can be electrically and mechanically bonded to a CMOS structure 102 with eutectic bonds 113 and 123. MEMS structure 501 can comprise a handle wafer 510 that can be fusion bonded to an actuator layer 520 with bonds 503a, 503b, and 503c. Bonds 503a, 503b, and 503c are generally configured to provide mechanical bonds but not electrical bonds. MEMS structure 501 can also include a sense gap 530 created and bounded between the handle wafer 510, bond 503a, bond 503b, and the actuator layer 520. The handle wafer 510 can be electrically connected to the CMOS structure 102 via a spring 511, a cover post 512a, a metal conductor 514, actuator post 512b, and eutectic bond 113. The actuator layer 520 can be connected to the CMOS structure 102 via spring 121, actuator post 122, and eutectic bond 123. Additionally, a metal top (MTOP) layer/electrode 540 can be formed on top of the CMOS structure 102. The metal top layer/electrode 540 can be employed to form a variable capacitor between the actuator layer 520 and the metal top layer/electrode 540. The actuator layer 520 can be electrically connected to the CMOS layer 102 via spring 121, actuator post 122, and eutectic bond 123. Depending on the shape and structure of the metal top layer/electrode 540, sensor 500 can be configured to be a pressure sensor with differential sensing electrodes or a combination sensor wherein the pressure sensor is combined and/or configured with one or more of a humidity/chemical sensing device, a pressure sensor drift compensation electrode device, an out of plane acceleration sensing device, and/or a MEMS pump, used to draw air into the sensor from outside the device package.

In regard to the conductors depicted in FIGS. 1-5 as conductor 114, conductor 214, conductor 314, conductor 414, and conductor 514, these conductors can be formed to achieve a direct electrical coupling between the MEMS structure (variously depicted as MEMS structure 101, MEMS structure 201, MEMS structure 301, MEMS structure 401, and MEMS structure 501) and the CMOS structure 102 without the necessity of a wire-bond conductor (e.g., conductor 114, conductor 214, conductor 314, conductor 414, and conductor 514) can be formed by etching or patterning one or more vias through, for instance and with reference to FIG. 1, actuator post 112b, bond 103c and cover post 112a, and thereafter filling the one or more etched or patterned vias with a conductive material, such as polysilicon, tungsten, gold, titanium, titanium nitride, aluminum, and/or germanium.

Figure 6:
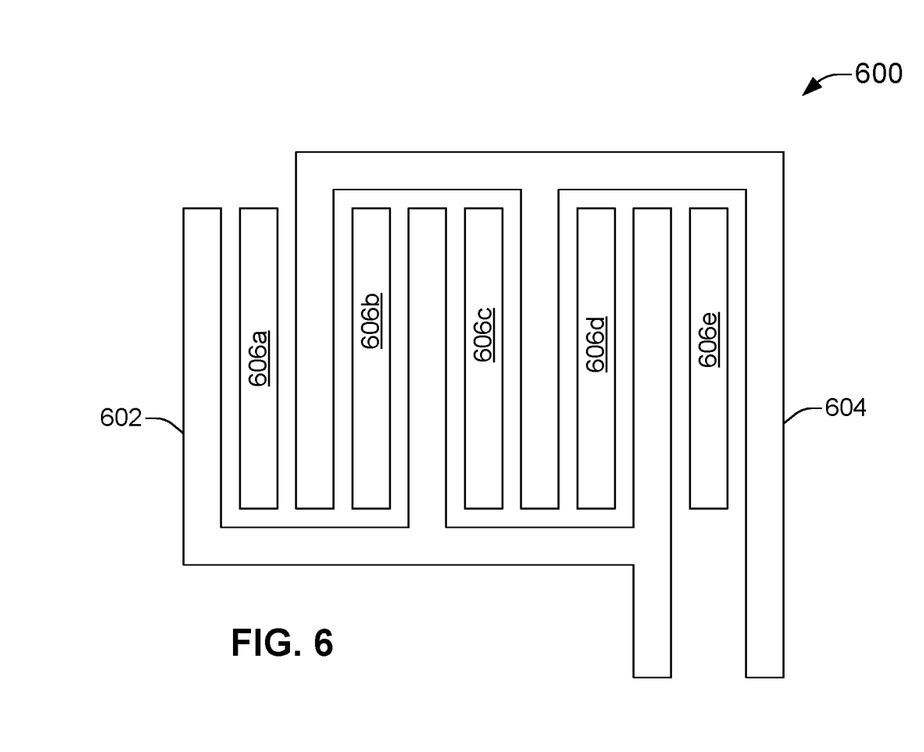
FIG. 6 illustrates a structure of a metal top layer/electrode used to construct or configure a humidity or chemical sensor 600 in accordance with a sixth embodiment.

FIG. 6 depicts an illustrative structure of a metal top layer/electrode (e.g., metal top electrode/layer 540) that can be utilized to construct or configure, for example, a humidity or chemical sensor 600. In accordance with an embodiment, the humidity or chemical sensor 600 can comprise a variable capacitor/resistor formed between a first top electrode/layer 602 and a second metal top electrode/layer 604. An inductor 606 can be interposed between the first top electrode/layer 602 and the second metal top electrode/layer 604. The inductor 606 can have dielectric and/or resistive properties that can change with humidity and/or in response to detection of some other ambient chemical property or on detection of particulate matter to create an environmental humidity or chemical sensor.

In an additional and/or alternative embodiment, the first top electrode/layer 602 and the second metal top electrode/layer 604 can be utilized to compensate for drift of a pressure sensor calls from environmental changes.

Figure 7:
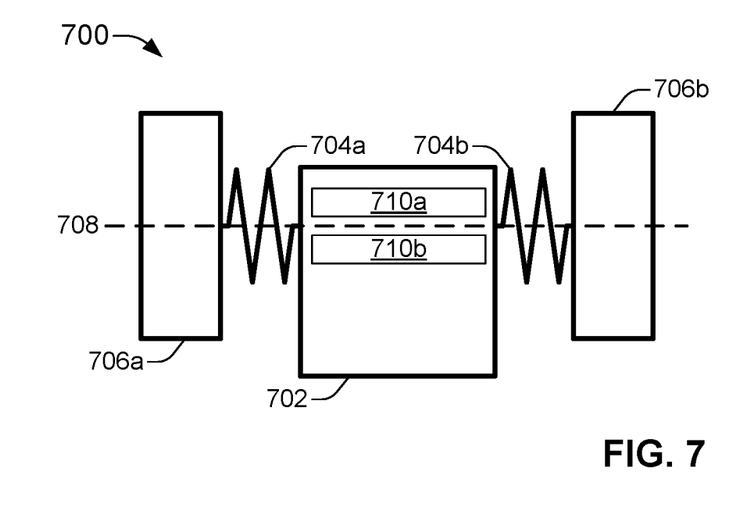
FIG. 7 depicts a plan view of a combination pressure sensor and out of plane acceleration sensor 700 in accordance with a seventh embodiment.

FIG. 7 illustrates a plan view of a combination pressure sensor and out-of-plane acceleration sensor 700. In accordance with an embodiment, the combination pressure sensor and out-of-plane acceleration sensor 700 can comprise a pressure sensor 702 connected to a CMOS structure via a first spring 704a and a second spring 704b and first post 706a and second post 706b. When the combination pressure sensor and out of plane acceleration sensor 700 is subjected to out-of-plane acceleration the pressure sensor 702 will rotate about axis 708, the rotation of the pressure sensor 702 can be detected using a first metal top variable capacitor 710a and second metal top variable capacitor 710b.

Figure 8:
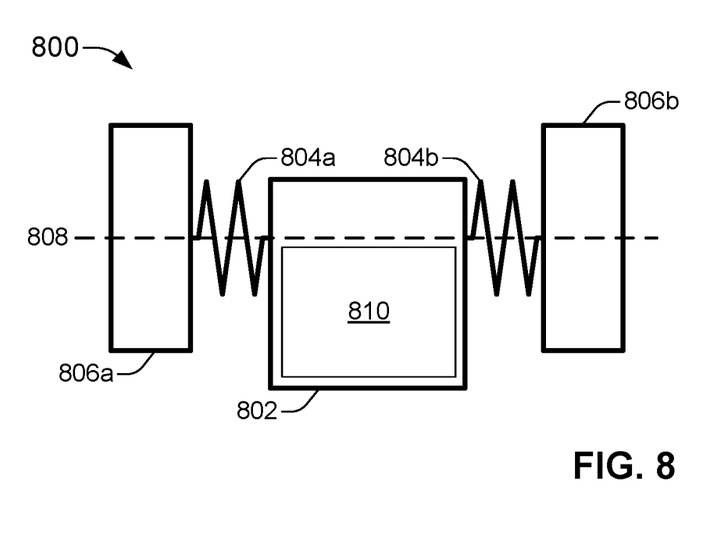
FIG. 8 illustrates a plan view of a pressure sensor and MEMS pump combination 800, in accordance with an eighth embodiment.

FIG. 8 illustrates a plan view of a pressure sensor and MEMS pump combination 800. The pressure sensor and MEMS pump combination 800 can be comprised of a pressure sensor 802 coupled to a CMOS structure via first spring 804a and second spring 804b and first post 806a and second post 806b. Further, the pressure sensor and MEMS pump combination 800 can comprise a drive electrode 810 placed under the pressure sensor 802, such that when the drive electrode 810 is excited, the drive electrode 810 causes the pressure sensor 802 to deflect causing the ambient environment to be displaced and move in and out of the pressure sensor and MEMS pump combination 800. As will be appreciated by those of ordinary skill, temperature, humidity, chemical, and/or other sensors can be combined with a MEMS pump and pressure sensor combination 800 in order to sample ambient environment air. Moreover, the MEMS pump and pressure sensor combination 800 can be advantageous in instances where the sampling of ambient environment outside the confines of the sensor package is a requirement.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above-described components, devices, systems and the like, the terms (including reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified subcomponents, some of the specified components or subcomponents, and/or additional components, and according to various permutations and combinations of the foregoing. Subcomponents can also be implemented as components communicatively coupled to other components rather than included within parent components (hierarchical). Additionally, it should be noted that one or more components may be combined into a single component providing aggregate functionality or divided into several separate subcomponents, and any one or more middle layers, may be provided to communicatively couple to such subcomponents in order to provide integrated functionality. Any component described herein may also interact with one or more other components not specifically described herein.

In addition, while a particular feature of the subject disclosure may have been disclosed with respect to only one of the several implementations, such feature may be combined with one or more other features of the other implementations as may be desired and advantageous for any given or particular application. Furthermore, to the extent that the terms "includes," "including," "has," "contains," or variants thereof, and other similar words are used in either the detailed description or the claims, these terms are intended to be inclusive in a manner similar to the term "comprising" as an open transition word without precluding any additional or other elements.

What is claimed is:

1. A device, comprising:
   a micro-electro-mechanical system (MEMS) device layer, comprising:
      an actuator layer and a cover layer, wherein a portion of the actuator layer is coupled to the cover layer via a dielectric; and
      an out-of-plane sense element interposed between the actuator layer and the cover layer, wherein the MEMS device layer is connected to a complementary metal-oxide-semiconductor (CMOS) substrate layer via a spring and an anchor.

2. The device of claim 1, wherein the actuator layer moves out-of-plane in response to a stimulus from a change in a sense environment.

3. The device of claim 2, wherein the CMOS substrate layer further comprises integrated circuits that output signal data indicating a change in the stimulus.

4. The device of claim 1, wherein the MEMS device layer further comprises a cavity between the actuator layer and the cover layer.

5. The device of claim 4, wherein the cavity is sealed.

6. The device of claim 5, wherein the stimulus is an ambient pressure applied to the actuator layer.

7. The device of claim 1, wherein the out-of-plane sense element is a variable capacitor between the actuator layer and the cover layer.

8. The device of claim 1, wherein the spring is formed in the actuator layer.

9. The device of claim 1, wherein the spring is formed in the cover layer.

10. The device of claim 1, wherein the anchor is centrally located on the actuator layer.

11. The device of claim 1, wherein the MEMS device layer further comprises a conductor that electrically couples the cover layer to the CMOS substrate layer.

12. The device of claim 1, wherein the MEMS device layer further comprises a reference layer coupled via a dielectric to the cover layer.

13. The device of claim 12, wherein the MEMS device layer further comprises a reference element formed between the reference layer and the cover layer.

14. The device of claim 13, wherein the CMOS substrate layer further comprises integrated circuits that output signal data indicating a change in a sense element and a change in the reference element.

15. The device of claim 2, wherein the CMOS substrate layer further comprises a top electrode.

16. The device of claim 15, further comprising a CMOS sensing element interposed between the top electrode and the actuator layer.

17. The device of claim 16, wherein the CMOS substrate layer outputs signal data based on first data received from the sense element and second data received from the CMOS sensing element, wherein the first data and the second data represent a stimulus being applied to the actuator layer.

18. The device of claim 15, wherein the top electrode detects ambient humidity.

19. The device of claim 15, wherein the top electrode detects an airborne particle.

20. The device of claim 16, further comprising an actuator interposed between the top electrode and the actuator layer, wherein the top electrode actuates the MEMS device layer out-of-plane and creates an air pump.

21. The device of claim 17, wherein the signal data is a first signal data, and wherein the CMOS substrate layer outputs third signal data representing an out-of-plane acceleration of the MEMS device layer.

22. The device of claim 1, wherein the MEMS device layer is coupled to the CMOS substrate layer via a eutectic bond.

23. A device, comprising:
a micro-electro-mechanical system (MEMS) layer, comprising:
an actuator layer partially coupled, by a dielectric, to a cover component;
an out-of-plane element formed between the actuator layer and the cover component;
an anchor component and a spring component that couples the MEMS layer to a complementary metal-oxide semiconductor (CMOS) layer; and
a conductor that electrically couples the cover component and the CMOS layer.

24. The device of claim 23, wherein the MEMS layer further comprises a sealed cavity formed between the cover component and the actuator layer, and wherein the cover component and the actuator layer are mechanically bonded to form the sealed cavity.

25. The device of claim 23, wherein the out-of-plane element is a variable capacitor formed between the actuator layer and the cover component.

26. The device of claim 23, wherein the MEMS layer further comprises a reference layer connected to the cover component with a dielectric.

27. The device of claim 26, wherein a reference element is formed between the reference layer and the cover component, and wherein the reference layer is connected to the CMOS layer.

28. The device of claim 27, wherein the CMOS layer outputs signal data representing a stimulus being applied to the actuator layer as measured by the out-of-plane element and the reference element.

29. The device of claim 23, wherein the CMOS layer further comprises a top electrode.

30. The device of claim 29, wherein the out-of-plane element is a first out-of-plane element, and wherein the CMOS layer further comprises a second out-of-plane element formed between the top electrode and the actuator layer.

31. The device of claim 30, wherein the CMOS layer outputs signal data representing a stimulus acting on the actuator layer as measured by the first out-of-plane electrode and the second out-of-plane electrode.

32. The device of claim 31, wherein the signal data is first signal data, and wherein the CMOS layer outputs second signal data representing an acceleration of the MEMS layer as measured by the second out-of-plane element.

33. The device of claim 29, wherein the top electrode detects an ambient humidity.

34. The device of claim 29, wherein the top electrode detects a particulate.

35. The device of claim 29, wherein the top electrode causes the MEMS layer to oscillate to form an air pump.

36. The device of claim 23, wherein the conductor is a conductive material comprising polysilicon, tungsten, gold, titanium, titanium nitride, aluminum, or germanium.

* * * * *